(12) United States Patent
Brausch et al.

(10) Patent No.: US 8,709,369 B2
(45) Date of Patent: Apr. 29, 2014

(54) PROCESS FOR PREPARING HIGHER HYDRIDOSILANES

(75) Inventors: Nicole Brausch, Essen (DE); Guido Stochniol, Haltern am See (DE); Thomas Quandt, Marl (DE)

(73) Assignee: Evonik Degussa GmbH, Essen (DE)

( * ) Notice: Subject to any disclaimer, the term of this patent is extended or adjusted under 35 U.S.C. 154(b) by 208 days.

(21) Appl. No.: 13/498,206

(22) PCT Filed: Aug. 13, 2010

(86) PCT No.: PCT/EP2010/061825
§ 371 (c)(1),
(2), (4) Date: Mar. 26, 2012

(87) PCT Pub. No.: WO2011/038977
PCT Pub. Date: Apr. 7, 2011

(65) Prior Publication Data
US 2012/0263639 A1    Oct. 18, 2012

(30) Foreign Application Priority Data

Oct. 2, 2009   (DE) .......................... 10 2009 048 087

(51) Int. Cl.
*C01B 33/04*   (2006.01)
(52) U.S. Cl.
USPC ......................................... 423/347; 423/344
(58) Field of Classification Search
USPC ................................................ 423/347, 344
See application file for complete search history.

(56) References Cited

U.S. PATENT DOCUMENTS

| | | |
|---|---|---|
| 5,700,400 A | 12/1997 | Ikai et al. |
| 6,027,705 A | 2/2000 | Kitsuno et al. |
| 8,039,646 B2 | 10/2011 | Bade et al. |
| 8,246,925 B2 | 8/2012 | Schwarz et al. |
| 2009/0259063 A1 | 10/2009 | Lang et al. |
| 2010/0160649 A1 | 6/2010 | Lang et al. |
| 2010/0179340 A1 | 7/2010 | Lang et al. |
| 2010/0185004 A1 | 7/2010 | Lang et al. |
| 2011/0189072 A1 | 8/2011 | Brausch et al. |
| 2011/0268642 A1 | 11/2011 | Brausch et al. |
| 2012/0042951 A1 | 2/2012 | Stuetzel et al. |
| 2012/0214005 A1 | 8/2012 | Wieber et al. |
| 2013/0078176 A1 | 3/2013 | Stochniol et al. |
| 2013/0095026 A1 | 4/2013 | Oenal et al. |
| 2013/0099164 A1 | 4/2013 | Stochniol et al. |
| 2013/0168824 A1 | 7/2013 | Wieber et al. |

FOREIGN PATENT DOCUMENTS

| | | |
|---|---|---|
| EP | 2 135 844 | 12/2009 |
| JP | 3 183613 | 8/1991 |
| WO | 2011 104147 | 9/2011 |

OTHER PUBLICATIONS

U.S. Appl. No. 13/989,823, filed May 28, 2013, Wieber, et al.
U.S. Appl. No. 13/824,641, filed Mar. 18, 2013, Wieber, et al.
U.S. Appl. No. 13/991,261, filed Jun. 3, 2013, Stenner, et al.
U.S. Appl. No. 13/885,316, filed May 14, 2013, Stenner, et al.
U.S. Appl. No. 13/991,986, filed Jun. 6, 2013, Brausch, et al.
U.S. Appl. No. 13/522,514, filed Sep. 26, 2012, Stochniol, et al.
U.S. Appl. No. 13/816,569, filed May 16, 2013, Latoschinski, et al.
U.S. Appl. No. 13/988,029, filed May 17, 2013, Becker, et al.
U.S. Appl. No. 13/977,984, filed Jul. 2, 2013, Schladerbeck, et al.
U.S. Appl. No. 14/005,413, filed Sep. 16, 2013, Oenal, et al.
U.S. Appl. No. 14/005,360, filed Sep. 16, 2013, Oenal, et al.
U.S. Appl. No. 14/005,979, filed Sep. 18, 2013, Wehner, et al.
U.S. Appl. No. 14/007,495, filed Sep. 25, 2013, Wehner, et al.
U.S. Appl. No. 13/510,373, filed Jul. 12, 2012, Wieber, et al.
U.S. Appl. No. 13/574,376, filed Jul. 20, 2012, Wieber, et al.
International Search Report Issued Nov. 26, 2010 in PCT/EP10/61825 Filed Aug. 13, 2010.

*Primary Examiner* — Edward Johnson
(74) *Attorney, Agent, or Firm* — Oblon, Spivak, McClelland, Maier & Neustadt, L.L.P.

(57) ABSTRACT

The invention relates to a method for producing higher hydridosilane wherein at least one lower hydridosilane and at least one heterogeneous catalyst are brought to reaction, wherein the at least one catalyst comprises Cu, Ni, Cr and/or Co applied to a carrier and/or oxide of Cu, Ni, Cr and/or Co applied to a carrier, the hydridosilane that can be produced according to said method and use thereof.

17 Claims, No Drawings

PROCESS FOR PREPARING HIGHER HYDRIDOSILANES

The invention relates to a process for preparing higher hydridosilanes by means of a dehydropolymerization reaction of lower hydridosilanes, to the higher hydridosilanes prepared by the process, and to the use of the higher hydridosilanes for producing electronic or optoelectronic component layers and for producing silicon-containing layers.

Hydridosilanes or mixtures thereof, especially higher hydridosilanes or mixtures thereof, are described in the literature as possible reactants for the generation of silicon layers. Hydridosilanes are understood to mean compounds which contain essentially only silicon and hydrogen atoms. Hydridosilanes in the context of the present invention are gaseous, liquid or solid and—in the case of solids—are essentially soluble in solvents such as toluene or cyclohexane, or in liquid silanes such as cyclopentasilane. Examples include monosilane, disilane, trisilane and cyclopentasilane. Higher hydridosilanes, i.e. those having at least two silicon atoms, may have a linear, branched or (optionally bi-/poly-)cyclic structure with Si—H bonds, and can be described by the particular generic formulae $Si_nH_{2n+2}$ (linear or branched; where n≥2), $Si_nH_{2n}$ (cyclic; where n≥3) or $Si_nH_{2(n-i)}$ (bi- or polycyclic; n≥4; i={number of cycles}−1).

For example, EP 1 087 428 A1 describes processes for producing silicon films, in which hydridosilanes having at least three silicon atoms are used. EP 1 284 306 A2 describes, inter alia, mixtures containing a hydridosilane compound with at least three silicon atoms and at least one hydridosilane compound selected from cyclopentasilane, cyclohexasilane and silylcyclopenta-silane, which can likewise be used to produce silicon films.

Higher hydridosilanes can be prepared, for example, by dehalogenation and polycondensation of halosilanes with alkali metals (GB 2 077 710 A). However, a disadvantage of this process is that partially halogenated silanes are obtained as impurities, which are disadvantageous especially for the further processing of the products to give silicon intended for the semiconductor industry, since they lead to silicon layers with disadvantageous properties.

Other processes for preparing hydridosilanes are based on a dehydropolymerization reaction of hydridosilanes, in which 1) higher hydridosilanes are formed from the lower hydridosilanes, especially $SiH_4$, with formal elimination of $H_2$, 1) thermally (U.S. Pat. No. 6,027,705 A in the case that no catalyst is used) and/or 2) by use of catalysts such as a) elemental transition metals (heterogeneous catalysis; U.S. Pat. No. 6,027,705 A in the case that platinum group metals, i.e. Ru, Rh, Pd, Os, Ir, Pt, are used; U.S. Pat. No. 5,700,400 A for metals of groups 3B-7B and 8—i.e. the transition metals/lanthanides excluding the Cu and Zn groups), b) non-metal oxides (heterogeneous catalysis; U.S. Pat. No. 6,027,705 A in the case that $Al_2O_3$ or $SiO_2$ is used), c) hydridic cyclopentadienyl complexes of scandium, yttrium or rare earths (homogeneous catalysis; U.S. Pat. No. 4,965,386 A, U.S. Pat. No. 5,252,766 A), d) transition metal complexes (homogeneous catalysis; U.S. Pat. No. 5,700,400 A for complexes of metals of groups 3B-7B and 8—i.e. the transition metals/lanthanides excluding the Cu and Zn groups; JP 02-184513 A) or e) particular transition metals immobilized on a support (heterogeneous catalysis; U.S. Pat. No. 6,027,705 A in the case that platinum group metals are used on a support, for example $SiO_2$, U.S. Pat. No. 5,700,400 A for ruthenium, rhodium, palladium or platinum immobilized on carbon, $SiO_2$ or $Al_2O_3$) or transition metal complexes (heterogeneous catalysis, U.S. Pat. No. 6,027,705 A in the case that platinum group metal complexes are used on a support, for example $SiO_2$).

However, the processes known to date for preparing higher hydridosilanes have disadvantages: dehydropolymerization reactions performed purely thermally, i.e. without use of catalyst, have the disadvantage of a high thermal stress which promotes side reactions and decomposition reactions. Although the use of homogeneous catalysts can reduce the requirement for high reaction temperatures and hence the high thermal stress addressed, these catalysts have the disadvantage that they have to be removed in a complex manner and, furthermore, promote the formation of polysilin-like solids, especially $(SiH)_n$-containing polymeric solids which are insoluble in solvents and cyclopentasilane and have large values of n, which leads to disadvantages in the work-up of the reaction products and to reductions in yield. The heterogeneous processes known to date using elemental transition metals, pure non-metal oxides or particular transition metals or transition metal complexes applied to a support also have the disadvantage that sufficiently high conversions cannot be achieved thereby.

It is thus an object of the present invention to avoid the described disadvantages of the prior art.

These objects are achieved in accordance with the invention by a process for preparing higher hydridosilanes, in which
at least one lower hydridosilane and
at least one heterogeneous catalyst are reacted,
wherein the at least one catalyst comprises
Cu, Ni, Cr and/or Co applied to a support
and/or oxide of Cu, Ni, Cr and/or Co applied to a support.

As already stated above, higher hydridosilanes are understood to mean compounds containing essentially only silicon and hydrogen, which have a linear, branched or (optionally bi-/poly-)cyclic structure with Si—H bonds, and which can be described by the particular general formulae $Si_nH_{2n+2}$ (linear or branched; where n≥2), $Si_nH_{2n}$ (cyclic; where n≥3) or $Si_nH_{2(n-i)}$ (bi- or polycyclic; n≥4; i={number of cycles}−1).

Lower hydridosilanes are understood to mean compounds containing only silicon and hydrogen, which have a linear, branched or (optionally bi-/poly-)cyclic structure with Si—H bonds, and which can be described by the particular general formulae $Si_nH_{2n+2}$ (linear or branched; where n≥2), $Si_nH_{2n}$ (cyclic; where n≥3) or $Si_nH_{2(n-i)}$ (bi- or polycyclic; n≥4; i={number of cycles}−1), with the proviso that the number-average molecular weight of the lower hydridosilanes used is lower than that of the higher hydridosilanes which form.

The process according to the invention is particularly suitable for preparing higher hydridosilanes or mixtures thereof, consisting of or essentially comprising higher hydridosilanes where 2≤n≤20. However, depending on the reaction regime, it is also possible to obtain higher hydridosilanes where n>20. The process is very particularly suitable for preparing mixtures of higher hydridosilanes which essentially satisfy the abovementioned formulae where 2≤n≤10. Such a mixture contains generally $Si_2H_6$, $Si_3H_8$, n-$Si_4H_{10}$, n-$Si_5H_{12}$, n-$Si_6H_{14}$ as main components, optionally in addition to n-$Si_7H_{16}$, n-$Si_8H_{18}$, n-$Si_9H_{20}$ and n-$Si_{10}H_{22}$ as secondary components. Ways and means of determining the number-average molecular weight of the product and of stopping the process according to the invention on attainment of an appropriate number-average molecular weight are known to those skilled in the art.

The process according to the invention is particularly suitable for preparing linear hydridosilanes. Other products/secondary components typically preparable in a poorer yield may be branched hydridosilanes, for example i-$Si_6H_{14}$, and cyclic hydridosilanes, for example cyclopentahydridosilane (cyclo-$Si_5H_{10}$). It is also possible for small proportions of bi- or polycyclic hydridosilanes to form. The total proportion of these secondary components is typically not more than 10% by weight, based in each case on the sum of the hydridosilanes and of the secondary components.

In the present context, a heterogeneous catalyst is understood to mean a catalyst which is present in a different phase from the reactants. The catalyst used in the process according to the invention, which comprises metal or metal oxide applied to a support, is understood to mean a catalyst which comprises, on or blended with a substance which is intrinsically inert or less active (compared to the catalyst material) for this chemical reaction (the "support"), heterogeneous catalyst material applied essentially to the surface of the support material by coating, precipitation, impregnation or mixing. The catalyst material may be in elemental form or in a compound on the support and/or with atomic incorporation into the crystal or layer structure of the support material. The heterogeneous catalyst material used in the process according to the invention comprises copper, nickel, chromium and/or cobalt, which 1) applied to the particular support, i.e. as the elemental metal on the support and/or with atomic incorporation into the crystal or layer structure of the support material, and/or 2) as oxide applied to the support, i.e. a) as the metal oxide of a defined oxidation state, b) as a mixed-valency compound of different-valency oxides or c) at least one oxide in combination with the elemental metal, each of which may be present as chemical compound(s) on the support and/or with incorporation into the crystal or layer structure of the support material.

Lower hydridosilanes usable with preference, which offer the advantage of being readily available, are the compounds monosilane, disilane and trisilane. Owing to the gaseousness thereof at room temperature and the resulting possibility of handling them as gases, particular preference is given to monosilane and disilane. Very particular preference is given to a mixture of monosilane and disilane, which leads to particularly good yields.

The supports are preferably high-surface area substances, especially activated carbon, aluminium oxide (especially alumina), silicon dioxide, silica gel, silicates, kieselguhr, talc, kaolin, clay, titanium dioxide, zirconium oxide and zeolites, since these at the same time act as promoters for the "applied" catalysts, and can thus further increase the reaction rates. Particularly good reaction rates can be achieved with aluminium oxide as the support.

The at least one heterogeneous catalyst, especially the heterogeneous catalyst material applied to the support, preferably comprises, to achieve particularly good yields, apart from the copper, nickel, chromium or cobalt metals mentioned, no further transition metals, lanthanoids or actinoids in elemental form or as compounds.

A catalyst usable with preference is preparable by 1) impregnating the support with an aqueous solution of a salt of copper, nickel, chromium and/or cobalt, 2) drying, and 3) calcining, and it is also possible, if desired, to perform impregnation, drying and calcination under reducing or oxidizing conditions. It is thus possible to prepare catalysts comprising Cu, Ni, Cr or Co applied to a support particularly efficiently with selection of reducing conditions, whereas catalysts comprising oxide of Cu, Ni, Cr or Co applied to a support are preparable particularly efficiently with selection of oxidizing conditions. Before a reduction, the metal salt compounds, especially nitrates, can also be converted first to the oxidic form. Preference is given to drying at temperatures of 80-150° C. The calcination is effected preferably at temperatures of 300-600° C. The reduction is effected preferably at temperatures of 150° C.-500° C.

The percentage by weight of the Cu, Ni, Cr or Co, or of the oxide of Cu, Ni, Cr or Co, applied to the support is preferably in the range from 0.5 to 65% by weight, based on the total mass of the catalyst (support+catalyst material). This percentage by weight can be determined by applying solutions of known concentration to a calcined support and weighing on completion of drying, and second calcination (optionally under reducing or oxidizing conditions, and assuming that no metal is lost).

When the reaction is performed in the liquid phase in batchwise operation, the proportion of the catalyst is preferably 0.001-0.5%, more preferably 0.01-0.1% and most preferably 0.02-0.06% by weight, based on the mass of the liquid phase.

When the reaction is performed continuously in the gas phase, the GHSV (gas hourly space velocity), which is defined as GHSV=gas volume flow under STP conditions per h/catalyst volume, is preferably 0.1-4000 $h^{-1}$, more preferably 1-3000 $h^{-1}$, most preferably 10-1000 $h^{-1}$.

The temperature at which the process according to the invention is performed is not critical. However, the process according to the invention for preparing higher hydridosilanes is preferably performed at temperatures of 0-400° C. It is preferably performed at temperatures of 35-170° C., most preferably at temperatures of 140-160° C.

Preference is further given to using absolute pressures of 1-200 bar, more preferably 10-160 bar, most preferably 50-150 bar. Below 1 bar, the conversions are often unsatisfactory, and above 200 bar absolute the material requirements do not justify the investment.

The reaction time may be a few hours to several days. The proportion of higher silanes increases with the reaction time.

It may be advantageous to remove the desired higher silanes formed as intermediates in the reaction mixture and to supply the lower silanes used or possibly formed in the course of the reaction, especially disilane used or formed in the case that silanes having at least 3 silicon atoms are desired as products, back to the reaction.

The process according to the invention, moreover, may be performed in the presence or absence of a solvent. However, it is preferably performed in the presence of a solvent. Suitable solvents are in principle all of those which react neither with the feedstocks nor with the products. Solvents usable with preference are linear, branched and cyclic aliphatic and unsubstituted or substituted aromatic hydrocarbons (especially cyclic alkanes, benzene and toluene), ethers (especially dialkyl ethers, furans, or dioxanes), and also dimethylformamide, ethyl acetate or butyl acetate.

The process according to the invention can be performed in the presence or absence of gases which promote the progress of the reaction. For example, even unreactive gases, especially nitrogen, argon or helium, can be used to dilute the reaction mixture. In addition, to promote the progress of the reaction, especially to avoid reverse reactions, hydrogen formed can be removed.

However, it may also be advantageous not only not to remove the hydrogen formed but actually to supply the reaction with hydrogen: this may lead to reductions in the reaction rate, but reduces the formation of higher molecular weight solids. In the first instance, there is no limit to the proportion of hydrogen. It is guided by the feedstocks (lower hydridosilanes and catalyst) and the reaction conditions (pressure and temperature). The partial pressure of the hydrogen is preferably 1-200% of the pressure of the hydridosilanes used when gaseous silanes are used. In general, the proportion of hydrogen selected is such that the partial pressure of the hydrogen corresponds to at least 5% of the total pressure. Preference is given to a range of 5% to 80%, particular preference to a range of 5% to 50%.

If higher molecular weight secondary components disadvantageous for the further end uses have been obtained in the reaction (especially higher hydridosilanes having more than 20 silicon atoms), they can be removed by means of processes known to those skilled in the art, especially by means of distillation or by means of the use of adsorptive processes. Also possible is a purification using a crossflow membrane process with at least one membrane separation step using a permeation membrane.

The invention also provides the higher hydridosilanes prepared by the process according to the invention or mixtures thereof.

These higher hydridosilanes prepared in accordance with the invention or mixtures thereof are suitable for a multitude of uses. They are particular suitable for producing of electronic or optoelectronic component layers. The invention thus also provides for the use of the higher hydridosilanes obtainable by the process according to the invention for obtaining optoelectronic or electronic component layers. The higher hydridosilanes obtainable by the process according to the invention are preferentially suitable for producing charge-transporting components in optoelectronic or electronic components. The higher hydridosilanes obtainable by the process according to the invention are additionally suitable for producing silicon-containing layers, preferably elemental silicon layers.

A typical reaction profile is now described by way of example hereinafter: preference is given to using stainless steel reactors equipped with a glass liner, a thermocouple, a pressure transducer, a liquid sampler, an inlet and an outlet for the reactants as gases or liquids, and a catalyst basket. After the reactor basket has been filled with the catalyst, the catalysts are inertized repeatedly and then charged with solvent. The reactor is charged with the reactants via the gas inlets. Thereafter, the reactor is heated to the desired temperature and the reaction is started by starting the stirrer.

By their nature, the reaction times depend on the reactants and reaction parameters selected. The reaction times at reaction temperatures of 40° C. and pressures of 60 bar are typically approx. 1-24 hours.

The product mixture which forms, consisting of the higher hydridosilanes formed, optionally solvent and optionally unconverted reactants, can, after removal of the catalyst basket, be employed in the semiconductor or photovoltaic sector, since no contamination by troublesome secondary components is to be expected at a given purity of the feedstocks.

If higher molecular weight secondary components which are troublesome for the further end uses (especially higher hydridosilanes having more than 20 silicon atoms) have been obtained in the reaction, they can be removed before use of the reaction product by means of processes known to those skilled in the art, especially by means of distillation or by means of the use of adsorptive processes. Also possible is purification using a crossflow membrane process with at least one membrane separation step using a permeation membrane.

The examples which follow illustrate the subject-matter of the present invention, without restricting it.

EXAMPLES

A stainless steel reactor (MRS 500, Parr Instruments) equipped with a glass liner, a thermocouple, a pressure transducer, a liquid sampler, a gas inlet and gas outlet and a catalyst basket is charged with the particular heterogeneous catalyst in the amount according to Table 1 below (catalyst basket). Thereafter, the reactor is inertized three times (argon and reduced pressure in alternation) and charged with 30 ml of dried toluene.

The reactor (capacity 70 ml) is charged at room temperature with 60 bar of $SiH_4$ via the gas inlet, and heated to the particular temperature specified. The reaction is started by starting the stirrer (700 rpm). After a reaction time of 20 h, a liquid sample is taken. The liquid withdrawn is analysed by gas chromatography.

The samples are analysed by the internal standard method (heptane in this case). The amount of product reported corresponds to the sum of silanes detected.

k was determined between cyclopentasilane and heptane.

$$m(x) = \frac{F(x) \times m(St)}{F(St)} \times k \ \ sum = \sum_{x=2}^{x=max} Si_x$$

TABLE 1

| No. | Catalyst | Starting weight (g) | $(SiH_4)$ pressure (bar) | Solvent | t (h) | T (° C.) | Amount of product | T (° C.) | Amount of product |
|---|---|---|---|---|---|---|---|---|---|
| 1 | 14.3%[1] Co/$Al_2O_3$ | 0.5 | 60 | toluene | 20 | 40 | 0.015 | 150 | 0.02 |
| 2 | 20% NiO, 73% aluminosilicate, 7% $Al_2O_3$ | 0.4 | 60 | toluene | 20 | 40 | 0.004 | 150 | 0.013 |
| 3 | 9.4% Cu, 4.2% Ni, 0.84% Cr/$Al_2O_3$ | 0.4 | 60 | toluene | 20 | 40 | 0.041 | 150 | 0.043 |
| 4 | 9.1% Cu, 6.1% Ni/$Al_2O_3$ | 0.5 | 60 | toluene | 20 | 40 | 0.038 | 150 | 0.052 |
| 5 | 7.3% Cu, 3.3% Ni, 6.6% Cr/$Al_2O_3$ | 0.6 | 60 | toluene | 20 | 40 | 0.014 | 150 | 0.032 |
| 9 | 18.2% Ni, 0.23% Ba/$Al_2O_3$ | 0.5 | 60 | toluene | 20 | 40 | 0.045 | 150 | 0.053 |
| 10 | 5.3% oxidic Ni (via ammoniacal nickel salt solution) on $Al_2O_3$ support, calcined at 600° C. for 10 h | 0.4 | 60 | toluene | 20 | 40 | 0.042 | 150 | 0.046 |
| 11 | 5.3% oxidic Ni (via nickel nitrate solution) on $Al_2O_3$ support, calcined at 450° C. for 10 h | 0.4 | 60 | toluene | 20 | 40 | 0.026 | 150 | 0.062 |

TABLE 1-continued

| No. | Catalyst | Starting weight (g) | (SiH$_4$) pressure (bar) | Solvent | t (h) | T (° C.) | Amount of product | T (° C.) | Amount of product |
|---|---|---|---|---|---|---|---|---|---|
| 12 | 5.3% oxidic Ni (via ammoniacal nickel salt solution) on Al$_2$O$_3$ support, calcined at 450° C. for 10 h | 0.4 | 60 | toluene | 20 | 40 | 0.021 | 150 | 0.04 |
| 13 | 1% oxidic Ni (via ammoniacal nickel salt solution) on Al$_2$O$_3$ support, calcined at 450° C. for 10 h | 0.4 | 60 | toluene | 20 | 40 | 0.05 | | |
| 14 | 10.3% oxidic Ni (via ammoniacal nickel salt solution) on Al$_2$O$_3$ support, calcined at 450° C. for 10 h | 0.4 | 60 | toluene | 20 | 40 | 0.023 | 150 | 0.064 |
| | Comparative examples | | | | | | | | |
| 15 | 0.5% Pd/Al$_2$O$_3$ | 0.4-0.7 | 60 | toluene | 20 | 40 | 0 | 150 | 0.001 |
| 16 | 5% Pt/C | 0.3 | 60 | toluene | 20 | 40 | 0 | 150 | 0.001 |
| 17 | 1% Ru/Al$_2$O$_3$ | 0.6-0.7 | 60 | toluene | 20 | 40 | 0 | 150 | 0.001 |
| 18 | 1% Ru/TiO$_2$ | 0.7 | 60 | toluene | 20 | 40 | 0.001 | 150 | 0.002 |
| 19 | SiO$_2$ (Aerolyst 3041, Evonik Degussa GmbH) | 0.4 | 60 | toluene | 20 | 40 | 0 | 150 | |
| 20 | Al$_2$O$_3$ (Spheralite, Axens) | 0.3 | 60 | toluene | 20 | 40 | 0 | 150 | |

[1]Here and hereinafter, determined as % by weight of metal or metal oxide, based on the total mass of the support, by application of solutions of known concentration to a calcined support and weighing on completion of drying and second calcination (optionally under reducing or oxidizing conditions and assuming that no metal is lost)

The invention claimed is:

1. A process for preparing a higher hydridosilane, comprising:
reacting a lower hydridosilane in the presence of a heterogeneous catalyst,
wherein the catalyst comprises Cu, Ni, Cr, Co, copper oxide, nickel oxide, chromium oxide, cobalt oxide, or a combination thereof, applied to a support.

2. The process of claim 1,
wherein the lower hydridosilane is at least one hydridosilane selected from the group consisting of monosilane, disilane, and trisilane.

3. The process of claim 2,
wherein the lower hydridosilane is a mixture of monosilane and disilane.

4. The process of claim 1,
wherein the support comprises at least one substance selected from the group consisting of activated carbon, aluminium oxide, silicon dioxide, silica gel, a silicate, kieselguhr, talc, kaolin, clay, titanium dioxide, zirconium oxide, and and a zeolite.

5. The process of claim 1,
wherein the catalyst does not comprise any transition metals, lanthanoids, or actinoids, in elemental form or as compounds, except for copper, nickel, chromium, or cobalt.

6. The process of claim 1,
wherein the heterogeneous catalyst is obtained by a process comprising 1) impregnating the support with an aqueous solution of a salt of copper, nickel, chromium, cobalt, or a combination thereof, 2) drying the support, and 3) calcining the support.

7. The process of claim 1,
wherein a total percentage by weight of Cu, Ni, Cr, Co, and oxide thereof applied to the support is from 0.5 to 65%, based on the total mass of the support.

8. The process of claim 1,
wherein the reacting is in the presence of a solvent.

9. A hydridosilane or a mixture of hydridosilanes obtained in a process comprising the process of claim 1.

10. A process for producing an electronic or optoelectronic component layer, the process comprising:
preparing a higher hydridosilane by the process of claim 1, and
producing the electronic or optoelectronic component layer with the higher hydridosilane.

11. A process for producing a layer, the process comprising:
preparing a higher hydridosilane by the process of claim 1, and
producing the layer with the higher hydridosilane,
wherein the layer comprises silicon.

12. The process of claim 11, wherein the layer is an elemental silicon layer.

13. The process of claim 1,
wherein the reacting is in a liquid phase in batchwise operation, and
a proportion of the catalyst in the liquid phase is from 0.001 to 0.5% by weight.

14. The process of claim 1,
wherein the reacting is in a continuous reaction in a gas phase, and
a gas hourly space velocity is from 0.1 to 4000 h$^{-1}$.

15. The process of claim 1,
wherein a pressure of the reacting is from 1 to 200 bar.

16. The process of claim 8,
wherein the solvent is at least one solvent selected from the group consisting of a linear, branched, or cyclic aliphatic hydrocarbon; an unsubstituted or substituted aromatic hydrocarbon; an ether; dimethylformamide; ethyl acetate; and butyl acetate.

17. The process of claim 16,
wherein the solvent comprises at least one solvent selected from the group consisting of a cyclic alkane, benzene, toluene, a dialkyl ether, a furan, and a dioxane.

* * * * *